(12) United States Patent
Moindron

(10) Patent No.: US 6,590,349 B2
(45) Date of Patent: Jul. 8, 2003

(54) BIDIRECTIONAL FLIP-FLOP

(75) Inventor: Laurent Moindron, Notre Dame d'Oe (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 09/879,837

(22) Filed: Jun. 12, 2001

(65) Prior Publication Data

US 2002/0047535 A1 Apr. 25, 2002

(30) Foreign Application Priority Data

Jun. 16, 2000 (FR) .............................. 00 07723

(51) Int. Cl.[7] .................. H05B 37/00; H03K 17/13; G05B 24/02; H01L 29/74
(52) U.S. Cl. .................. 315/240; 315/241 R; 315/362; 327/452; 327/455; 257/121; 257/119; 323/324; 323/239
(58) Field of Search .............................. 315/240, 241 R, 315/194, 363, 362, 727, 128; 257/121, 137, 146, 154, 120, 119; 327/452, 455, 457, 453; 323/324, 239, 237, 320

(56) References Cited

U.S. PATENT DOCUMENTS

| | | | |
|---|---|---|---|
| 5,512,810 A | * 4/1996 | Hansen et al. | 318/800 |
| 5,838,110 A | 11/1998 | Pezzani | 315/105 |
| 5,883,401 A | 3/1999 | Pezzani | 257/121 |
| 5,914,628 A | * 6/1999 | Rault | 327/451 |
| 6,208,126 B1 | * 3/2001 | Gonthier | 323/239 |
| 6,373,319 B1 | * 4/2002 | Rault | 327/452 |

OTHER PUBLICATIONS

French Search Report from French Patent Application 00/07723, filed Jun. 16, 2000.

Berlioux R. "L'alternistor, Thyristor Bidirectional, Principes et Applications" Electronique Industrielle, FR, Paris, vol. RT–45, No. 118, Nov. 1968, pp. 701–704.

* cited by examiner

Primary Examiner—Don Wong
Assistant Examiner—Tuyet T. Vo
(74) Attorney, Agent, or Firm—Wolf, Greenfield & Sacks, P.C.; James H. Morris

(57) ABSTRACT

A bidirectional switch, including a first bidirectional switch between two power terminals of the switch, a low-voltage storage element between a first power terminal and a control terminal of the switch, and a control stage adapted to cause, upon each halfwave beginning of an A.C. supply voltage applied between the power terminals and when the switch is on, the charge of the storage element with a biasing depending on the sign of the halfwave.

16 Claims, 4 Drawing Sheets

BIDIRECTIONAL FLIP-FLOP

BACKGROUND OF THE INVENTION

1. Field of the Invention

The present invention relates to bidirectional switches controllable by a low-voltage signal. The present invention more specifically relates to bidirectional switches intended for being connected in series with a load supplied by a high A.C. voltage, for example the mains and, among such switches, those that are controllable to be turned off and on.

2. Discussion of the Related Art

Switches for A.C. loads of the type to which the present invention relates are used, in particular, each time an interface circuit between a low-voltage control system, for example a microcontroller, and a load to be supplied by an A.C. high voltage, for example, an engine, a heating resistor, etc., is required.

An example of application of the present invention relates to electric household appliances, for example, washing machines, in which several loads (engines, pumps, heating resistors, valves) are to be controlled from the machine microcontroller.

Generally, a bidirectional switch adapted to being controlled by a low-voltage signal is formed of a triac in series with the load to be controlled and the gate of which receives a low-voltage control signal.

A problem that arises with a triac is that it must be started for each halfwave of the supply voltage since it blocks (is non-conducting) when the current disappears between its two power terminals. Accordingly, in conventional systems, a D.C. signal is often applied on the triac gate for the entire duration when it must be on.

A disadvantage is that this D.C. signal, generally provided by a microcontroller that draws its power from a low-voltage power supply, results in continuous power consumption.

To avoid using a D.C. signal, a pulsed control is provided when one or several triacs are meant to be controlled by a microcontroller. The control is then performed by pulses upon each change of biasing of the A.C. power supply. These pulses, present during the entire closing time, monopolize the microcontroller. Further, for small loads, it is generally not possible to control the triac with a pulsed signal at the mains frequency. Indeed, the triac hold and starting cur-rents then have the same order of magnitude (some ten milliamperes) as the current in the load.

Another disadvantage is that the supply circuit of the microcontroller or the like then dissipates significant power, since a voltage conversion from a high A.C. supply voltage is most often used.

It would be desirable to have a high-voltage bidirectional switch that can be controlled by a low-voltage signal while reducing or minimizing the power consumption and the use of the possible control microcontroller.

Another disadvantage of the triac is that it provides no information about its state (on or off). Now, it can be desirable to known this state, for example, to detect a parasitic triggering.

SUMMARY OF THE INVENTION

Thus, an object of the present invention is to provide a bidirectional flip-flop capable of being controlled by an irregular pulsed signal, that is, only providing one pulse for the turning-on and one pulse for the turning-off.

The present invention also aims at providing a bidirectional switching circuit respecting the structure of a triac, that is, including two power terminals and one control terminal. Thus, another object of the present invention is to enable control of the switch by a pulsed signal applied on a single terminal of the circuit.

The present invention also aims at providing an autonomous circuit, that is, a circuit requiring no external low-voltage power supply for its operation.

The present invention also aims at enabling detection, by the control circuit, of the state of the switch.

The present invention also aims at providing, in a simple way, an information about the state (off or on) of the switch.

The present invention further aims at providing a bidirectional switch that is entirely integrable.

To achieve these and other objects, the present invention provides a bidirectional switch, including a first bidirectional switching means between two power terminals of the switch, a low-voltage storage element between a first power terminal and a control terminal of the switch, and a control stage adapted to organize, upon each halfwave beginning of an A.C. supply voltage applied between the power terminals and when the switch is on, the charge of the storage element with a biasing depending on the sign of the halfwave.

According to an embodiment of the present invention, the turning-on of the switch is caused by the occurrence of a low-voltage pulse of charge of the storage element on said control terminal.

According to an embodiment of the present invention, the turning-off of the switch is caused by forcing the discharge of the storage element, so that the first bidirectional switching means remains blocked at the beginning of the following halfwave of the A.C. supply voltage.

According to an embodiment of the present invention, the switch includes a means for delaying the turning-on of the first bidirectional switching means with respect to the zero crossing of the A.C. supply voltage, to leave the storage element time to charge.

According to an embodiment of the present invention, the control stage includes a second bidirectional switching means between said control terminal and a second power terminal of the switch.

According to an embodiment of the present invention, the control stage includes at least one switch connecting the control terminal of the second switching means to the first power terminal of the switch.

According to an embodiment of the present invention, said second bidirectional switching means is formed of two control thyristors connected in antiparallel and the respective gates of which are individually connected to a first terminal of application of the A.C. supply voltage via a switch of the control stage.

According to an embodiment of the present invention, said second bidirectional switching means is a triac having its gate connected to a first terminal of application of the A.C. supply voltage via a switch of the control stage.

According to an embodiment of the present invention, said first bidirectional switching means is formed of two one-way switching elements connected in antiparallel between the two power terminals of the switch.

According to an embodiment of the present invention, said switching elements are formed by power thyristors respectively with a cathode and an anode gate, the gates of said power thyristors being individually connected to the control terminal of the switch via a Zener diode.

According to an embodiment of the present invention, each power thyristor is associated with a control thyristor having the same type of gate.

According to an embodiment of the present invention, said first bidirectional switching means is a triac having its gate connected, via two Zener diodes connected head-to-tail, to the control terminal.

The foregoing objects, features and advantages of the present invention, will be discussed in detail in the following non-limiting description of specific embodiments in connection with the accompanying drawings.

DETAILED DESCRIPTION

Figure 3:
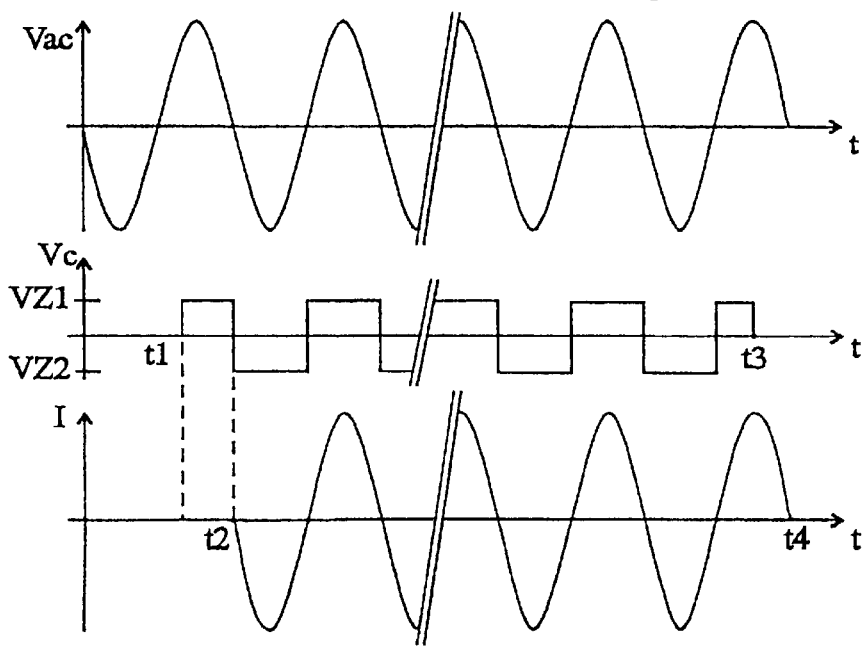
FIG. 3 illustrates, in the form of timing diagrams, the simplified operation of a switch such as shown in FIG. 2.
Figure 4:
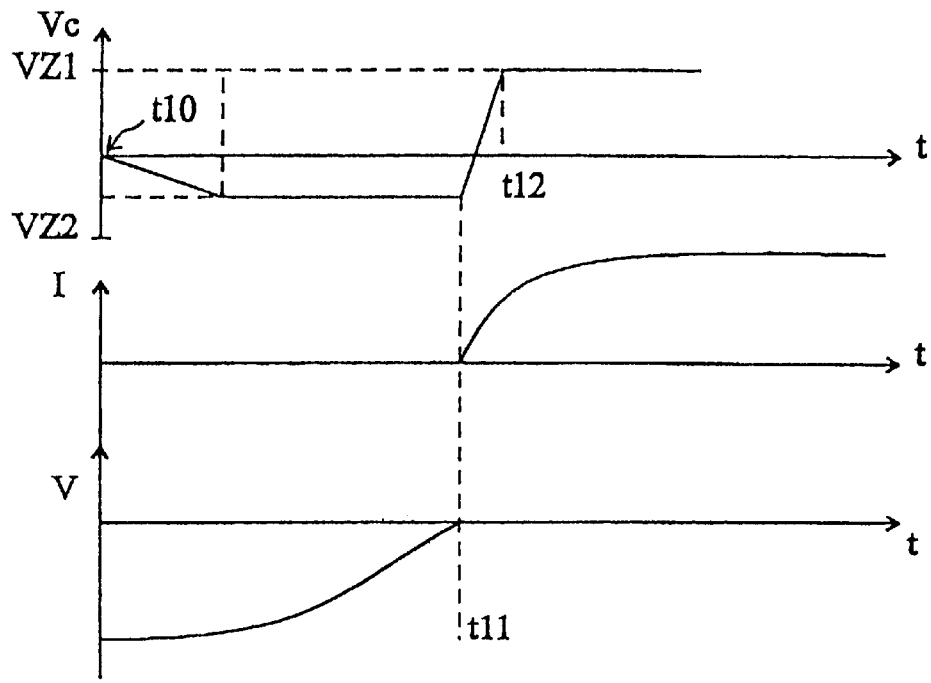
FIG. 4 details, in the form of timing diagrams, the initial turning-on of the switch of FIG. 2.
Figure 5:
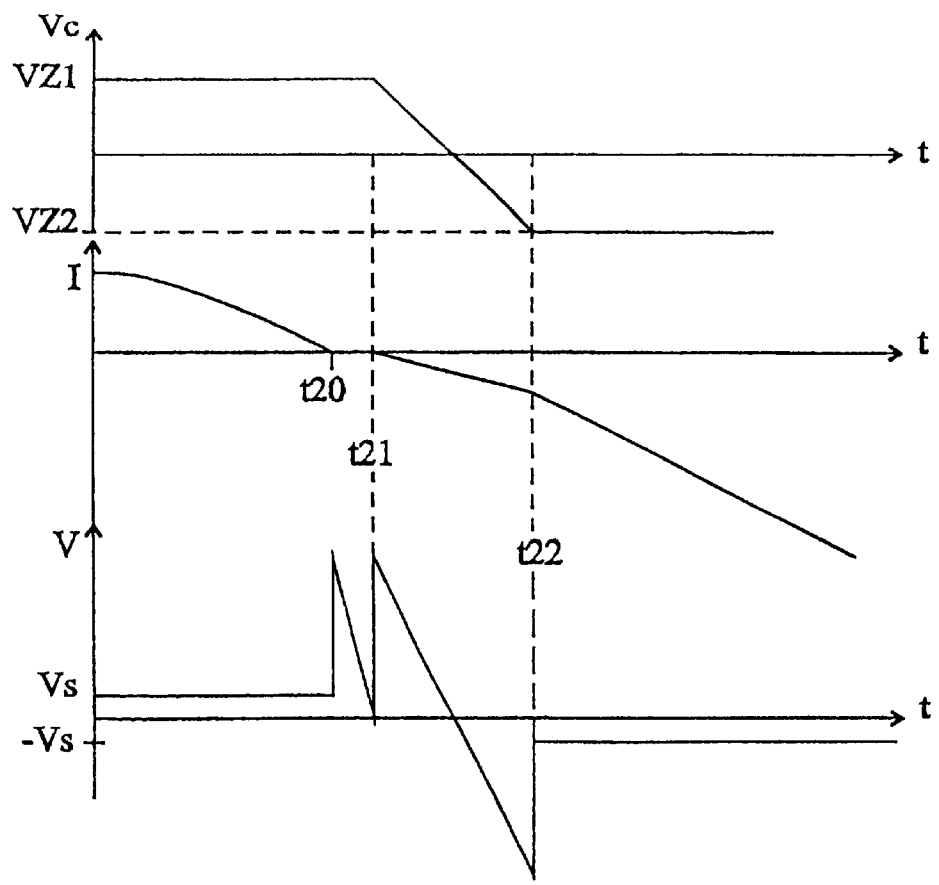
FIG. 5 details, in the form of timing diagrams, the operation of the switch of FIG. 2 in a change of halfwave of the A.C. supply voltage.

The same elements have been designated by same references in the different drawings. For clarity, only those elements that are necessary to the understanding of the present invention have been shown in the drawings and will be described hereafter. In particular, the A.C. load to be controlled by the switch of the present invention has not been detailed. Further, the timing diagrams of FIGS. 3, 4, and 5 are not drawn to scale.

A feature of the present invention is to associate a bidirectional switching element with a control stage drawing the power necessary to maintain the switch in an on state on the A.C. supply voltage. This control stage, according to the present invention, is adapted to receiving single control pulses to cause switching of state.

Figure 1:
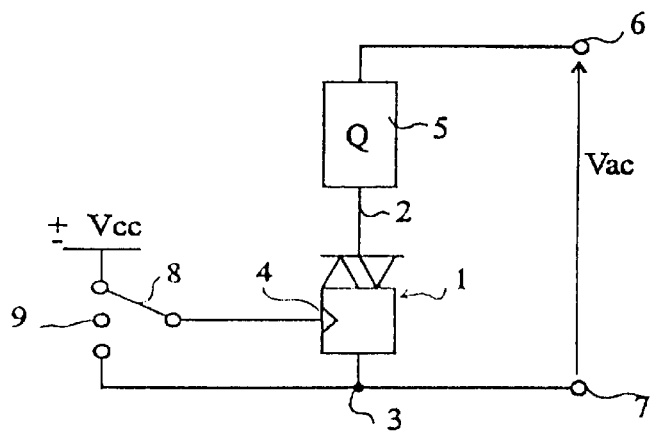
FIG. 1 very schematically shows a bidirectional switch according to the present invention associated with a load supplied by a high A.C. voltage.

FIG. 1 very schematically shows the connection of a switch according to the present invention.

Switch 1 includes, as seen from the outside, two power terminals 2, 3, respectively, and a low-voltage control terminal 4. Switch 1 is intended for being connected in series with a load (Q) 5 to be controlled between two terminals 6 and 7 of application of an A.C. voltage Vac. Control terminal 4 is intended for receiving, for each desired turning-on of the switch, a single control pulse. This pulse has a positive or negative biasing with respect to the quiescent potential of terminal 3. This quiescent potential represents both the ground of the low-voltage control circuit (not shown) and the zero of voltage Vac. Terminal 4 is then left in the air (terminal 9) for all the time during which the switch must remain on. The turning-off of switch 1 is caused by a connection of terminal 4 to terminal 3. The control is, for example, performed by means of a switch 8 having three positions. This switch connects terminal 4 to, respectively, a low positive or negative potential (for example, 5 volts) Vcc, a connection in the air or a disconnection, and terminal 3. The position where terminal 4 is connected to terminal 3 is, preferably, the quiescent position of the off switch.

According to the present invention, the biasing of the pulse is of no importance. The switch is turned on, possibly with a slight delay as will be seen hereafter, by the first pulse that occurs on its control terminal after its powering-on.

Figure 2:
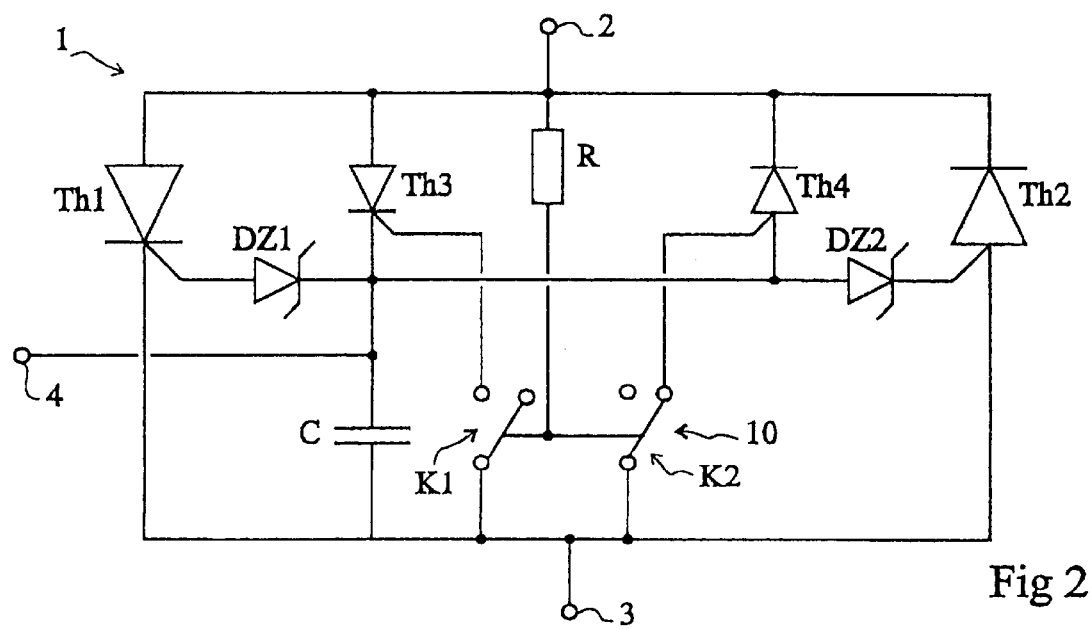
FIG. 2 shows a more detailed embodiment of a bidirectional switch according to the present invention.

FIG. 2 shows an embodiment of a switch according to the present invention. Two power thyristors Th1 and Th2 connected in antiparallel between power terminals 2 and 3 of switch 1 are used. Each thyristor Th1 or Th2 is assigned to one of the halfwaves of A.C. voltage Vac. For example, thyristor Th1 is connected by its anode to terminal 2 while thyristor Th2 is connected by its anode to terminal 3. Each thyristor Th1, Th2, is associated with a drive or triggering thyristor Th3, Th4, the function of which is, among others, to ensure the conduction at the beginning of a halfwave. The respective anodes of thyristors Th1 and Th3 are connected to terminal 2 while the cathodes of thyristors Th2 and Th4 are connected to terminal 2. The cathode of thyristor Th3 is connected, via a Zener diode DZ1, to the cathode gate of thyristor Th1, the anode of Zener diode DZ1 being connected to this gate. The anode of thyristor Th4 is connected, via a Zener diode DZ2, to the anode gate of thyristor Th2, the cathode of the Zener diode being connected to this gate.

Another feature of the present invention is to use a capacitor C intended for storing the on state of the switch. According to the present invention, the charge biasing of capacitor C changes upon each halfwave of the A.C. power supply. A first electrode of capacitor C is connected to terminal 3. A second electrode of capacitor C is connected to terminal 4 of control of switch 1, to the cathode of thyristor Th3, and to the anode of thyristor Th4, and thus to the respective cathode and anode of diodes DZ1 and DZ2. The function of diodes DZ1 and DZ2 is to delay the triggering of thyristors Th1 and Th2 to leave time to capacitor C to recharge to voltage VZ1 or VZ2 (representing the threshold voltage of the corresponding Zener diode DZ1 or DZ2) according to which thyristor Th3 or Th4 is on.

Another feature of the present invention is to organize an automatic charge and discharge of capacitor C when the switch is on. For this purpose, a control stage 10 causes the discharge of capacitor C into the gate of thyristor Th3 or Th4 at the beginning of each new halfwave according to the biasing of the A.C. source. This enables recharge of the capacitor with an opposite biasing. Functionally, control stage 10 is formed of two switches K1 and K2. A first switch K1 connects, by its power terminals, the cathode gate of thyristor Th3 to terminal 3. A second switch K2 connects, by its power terminals, the anode gate of thyristor Th4 to terminal 3. The respective control terminals of switches K1 and K2 are connected, via a biasing resistor R, to terminal 2. Switches K1 and K2 operate in opposition. When switch K1 is open, leaving the gate of thyristor Th3 floating, switch K2 is closed, that is, it connects the gate of thyristor Th4 to terminal 3 and conversely. Switch K1 is intended to be closed at the beginning of negative halfwaves and switch K2 is intended to be closed at the beginning of positive halfwaves.

The operation of the circuit of FIG. 2 will be discussed in relation with FIGS. 3, 4, and 5.

FIG. 3 shows, in the form of timing diagrams, an example of courses of voltage Vac, of voltage Vc across capacitor C, and of current I through the switch, that is, flowing between terminals 2 and 3, and thus through the load. It is assumed that current I and voltage Vac are in phase, that is, that the load is purely resistive, although the present invention is operative on any type of load.

Initially, when the circuit formed of the series association of a switch 1 and of a load 5 is connected to A.C. supply terminals 6, 7 (FIG. 1), capacitor C (FIG. 2) of the switch is discharged. It is even, preferably, short-circuited by switch 8, the idle position of which interconnects terminals 3 and 4. As an alternative, the idle position of switch 8 places terminal 4 floating, or as will be described hereafter, connects it to the input of a microcontroller or the like to detect the state of the switch. Assuming that thyristor Th1 is assigned to positive halfwaves, the circuit portion formed by thyristors Th2 and Th4 is reverse biased during positive halfwaves. Further, thyristors Th1 and Th3 cannot be triggered whatever the respective positions of switches K1 and K2. Indeed, terminal 4 is at the potential of terminal 3. Thus, no current can, upon positive halfwaves and even if switch K1 is closed, be injected onto the cathode gate of thyristor Th3, nor can it be injected onto that of thyristor Th1. A similar line of reasoning applies for negative halfwaves, where thyristors Th1 and Th3 are reverse biased. No current can thus be injected into the gate of thyristor Th4 or Th2 if capacitor C is discharged.

It is assumed that at a time t1, a low-voltage control pulse occurs on terminal 4, by a brief connection of switch 8 to voltage Vcc. This pulse, arbitrarily assumed to be of positive biasing, charges capacitor C while respecting this biasing.

If the pulse biasing is of the same sign as the ongoing halfwave, the beginning (time t2) of the halfwave of opposite sign will have to be awaited to then trigger thyristor Th4 and close the switch.

If capacitor C is charged with a biasing opposite to that present across terminals 2 and 3, the properly biased thyristor Th3 or Th4 immediately turns on.

As an alternative, the switch can turn on even if the control pulse is of same biasing as the current halfwave of the A.C. power supply. The duration of the control pulse, that is, the time during which switch 8 connects terminal 4 to potential +Vcc before leaving it in the air, must then be sufficient to charge the capacitor to level VZ1.

FIG. 4 illustrates, by timing diagrams with an enlarged time scale as compared to those of FIG. 3, the initial closing of a switch. A closing at the beginning of a positive halfwave, due to a pulse of negative biasing occurring in a negative halfwave, is here considered. The control pulse causes the charge of capacitor C (from a time t10). The charge level depends on the voltage level of the pulse applied on terminal 4 and it is here assumed that this level is smaller than threshold VZ2, but is sufficient to trigger thyristor Th3. The negative halfwave ends (curve V), the voltage across the capacitor decreasing since said capacitor is still open. At the end of the negative halfwave (time t11), when the voltage across the capacitor becomes positive, switch K1 (FIG. 2) turns on. Capacitor C then discharges into the gate of thyristor Th3. Said thyristor turns on and positively recharges capacitor C (preparing the next halfwave). Switch K1 turns off since there is no more voltage across the general switch. When (time t12) the voltage of capacitor C reaches threshold voltage VZ1 of Zener diode DZ1, thyristor Th1 is triggered. The circuit remains in this state until the end of the positive halfwave.

Current I in the "bistable triac" of the present invention depends on the current drawn by the load connected in series therewith. However, due to thyristor Th3, the turning-on begins close to the beginning of the halfwave even though thyristor Th1 is not conductive yet (that is, before time t12).

Be it in the example of FIG. 3 or in that of FIG. 4, the biasing of capacitor C enables, at the beginning of the negative halfwave (time t2, FIG. 3) following the occurrence of the turn on pulse, when capacitor K2 closes, discharge of capacitor C through the anode of thyristor Th4, its gate, switch K2, and terminal 3 connected to the first electrode of capacitor C. This flow enables triggering of capacitor Th4, placing the anode of diode DZ2 substantially at the potential of terminal 2. Thyristor Th2 is then triggered when the voltage thereacross (neglecting the series voltage drops in components Th4 and DZ2) becomes greater than threshold VZ2 of Zener diode DZ2. The capacitor discharge actually corresponds to a reversal of its biasing. Indeed, said capacitor maintains, across its terminals, a voltage set by the threshold value of diode DZ2 by drawing the necessary power from voltage Vac by the conduction of thyristor Th4. A little after the beginning of the negative halfwave, capacitor C is thus charged with a more positive potential on its first electrode (terminal 3), this preparing the next positive halfwave. The charge reversal of capacitor C is limited by diode DZ2 without which it would follow voltage Vac. In the next positive halfwave, control stage 10 switches. Switch K1 closes while switch K2 opens, resistor R taking part in the biasing necessary for the switching. This results in a discharge of capacitor C from its electrode connected to terminal 3 to its electrode connected to terminal 4. This discharge is performed, as previously indicated, by a current flow into the cathode gate of thyristor Th3 so that said thyristor triggers. When the charge of capacitor C on its electrode 4 becomes sufficient to exceed threshold VZ1 of Zener diode DZ1, said diode starts an avalanche and thyristor Th1 triggers.

In the timing diagrams of FIG. 3, the delays due to switchings have been neglected, so that it is considered that a current I flows through the switch from the beginning (time t2) of each halfwave.

FIG. 5 illustrates, by timing diagrams at an enlarged scale as compared to those of FIG. 3, a change of halfwave. Towards the end of the positive halfwave, the switch turns off (time t20) when the current flowing therethrough becomes smaller than the hold current of thyristor Th1. Voltage V thereacross, which was maintained at a level Vs corresponding to the series voltage drop in the on-state switch (substantially the series voltage drop across thyristor Th1) then joins the instantaneous amplitude of voltage Vac, then decreases with it. At the beginning of the negative halfwave (time t21), switch K2 closes, thus causing, as previously indicated, the discharge of capacitor C into the gate of thyristor Th4. The capacitor is immediately negatively recharged (see the course of voltage Vc). When (time t22) voltage Vc reaches threshold voltage VZ2 of Zener diode DZ2, thyristor Th2 triggers and the circuit remains in this state until the end of the negative halfwave. The voltage thereacross then is at a level —Vs corresponding to the series voltage drop in thyristor Th2 in the on state. Between times t21 and t22, voltage V across the switch of the present invention substantially follows the course of the voltage across capacitor C as soon as thyristor Th4 is on. In FIG. 5, it is assumed, for simplification, that thyristor Th4 is on from as soon as the beginning of the halfwave (time t21).

It should be noted that all the power necessary to the switch operation is, as long as said switch is on, drawn from the high A.C. voltage, terminal 4 being floating or with a high impedance.

To turn off the switch of the present invention, the discharge of capacitor C must be forced (time t3, FIG. 3). For this purpose, it is short-circuited by means of switch 8. The conduction of the switch stops at the end of the halfwave (time t4) by the disappearing of the current flowing through the thyristors.

After the disappearing of the turn-on control pulse, voltage Vc on control terminal 4 of the switch of the present invention indicates the state thereof and more specifically its conduction direction. Accordingly, a bidirectional flip-flop of the present invention exhibits, on its control terminal, an indication of its state of operation. If the terminal is a zero potential, the switch is off. If it is at a positive or negative voltage, the switch is on. Further, the conduction direction of the switch is indicated by the biasing of the signal present on terminal 4. Thus, the sign of the ongoing halfwave may be read. Such a feature may be used, for example, to synchronize other control signals of a system using several loads controlled by several switches. It will then be ascertained to perform a detection respecting the isolation of terminal 4 with respect to terminals Vcc and to avoid discharge of capacitor C.

Thyristors Th2 and Th4, which are anode-gate thyristors, will be chosen to have a good reverse breakdown voltage since they must withstand voltage Vac, for example, the mains at 220 volts. A diode in series with each of these anode-gate thyristors may also be provided on the cathode side. As an alternative, a structure adapted to this breakdown voltage between the cathode and the anode gate will be chosen.

Control stage 10 (FIG. 2) can be made in several ways according to the components used. In all cases, it will be provided to maintain the desired functionality which is that, alternately according to the biasing of the supply voltage, a single one of switches K1 or K2 is closed. Three examples will be described hereafter in relation with FIGS. 6, 7, and 8. The components of the switch according to the present invention that have not been shown in these drawings (in particular thyristors Th1 and Th2) and their respective connections can be deduced from FIG. 2.

Figure 6:
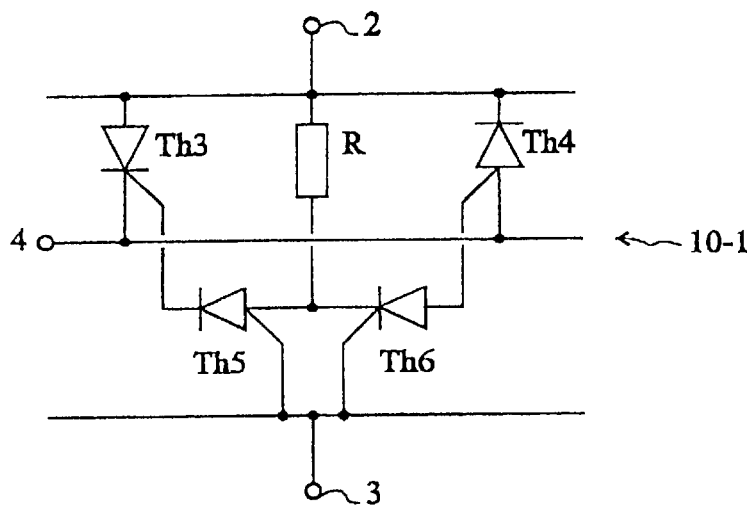
FIG. 6 shows a first embodiment of a control stage of a switch according to the present invention.
Figure 7:
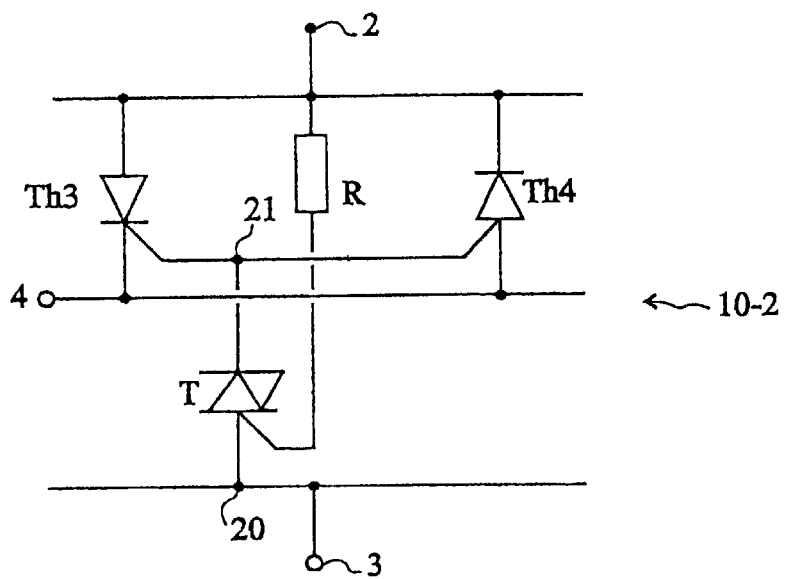
FIG. 7 shows a second embodiment of a control stage of a switch according to the present invention.
Figure 8:
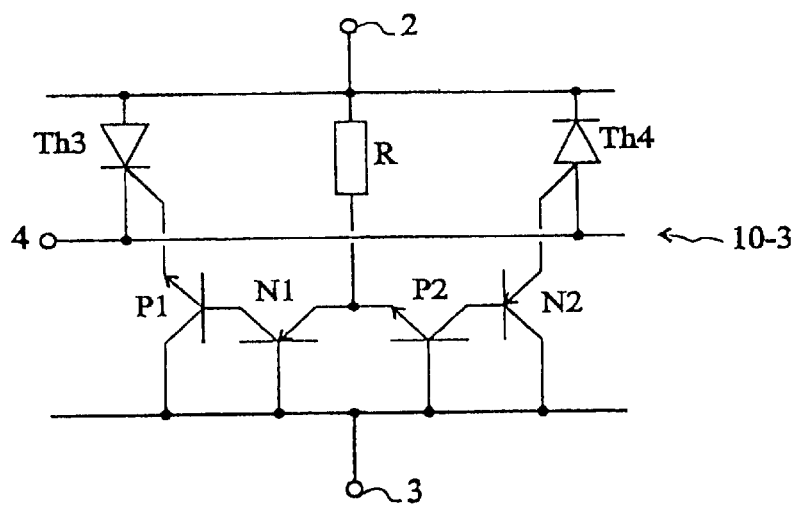
FIG. 8 shows a third embodiment of a control stage of a switch according to the present invention.

In the assemblies illustrated in FIGS. 6 to 8, thyristor Th3 is associated with the positive halfwaves between terminals 2 and 3. Thyristor Th4 is associated with negative halfwaves.

FIG. 6 shows a first embodiment of a control stage 10-1 according to the present invention. This embodiment is based on the use of thyristors Th5 and Th6 to form switches K1 and K2. Thyristor Th5 is an anode-gate thyristor having its anode connected to a first terminal of resistor R and to the cathode of thyristor Th6. The cathode of thyristor Th5 is connected to the gate of thyristor Th3. The anode of thyristor Th6 is connected to the anode gate of thyristor Th4. The respective gates of thyristors Th5 and Th6 are connected to terminal 3, and thus directly to one of the terminals of application of A.C. voltage Vac. Thyristor Th5 is turned on during positive halfwaves and thyristor Th6 is turned on during negative halfwaves.

The residual power consumption of the switch of the present invention is linked to the residual power consumption of its control stage 10. In the off state, this power consumption is, in the example of FIG. 6, limited to the gate leakage current of thyristors Th5 and Th6 and to the power dissipation in resistor R. Indeed, as long as capacitor C (not shown in FIG. 6) is not initially charged by a control pulse, none of thyristors Th5 or Th6 can be turned on to trigger one of thyristors Th3 or Th4.

FIG. 7 shows a second embodiment of a control stage 10-2 according to the present invention. This embodiment uses a triac T to form both switches K1 and K2. A first power terminal 20 of triac T is connected to terminal 3 while a second power terminal 21 is connected to the gates of thyristors Th3 and Th4. The gate of triac T is connected, via resistor R, to terminal 2 of the switch. Triac T is turned on at the beginning of each halfwave starting from the time when capacitor C has a non-zero charge.

FIG. 8 shows a third embodiment of a control stage 10-3 according to the present invention. This embodiment is based on the use of bipolar transistors to form switches K1 and K2. Switch K1 is formed of two bipolar transistors P1 and N1, respectively of NPN and PNP type. The emitter of transistor P1 is connected to the cathode gate of thyristor Th3. The collector of transistor P1 is connected to terminal 3. The base of transistor P1 is connected to the collector of transistor N1, the emitter of which is connected, via resistor R, to terminal 2. The base of transistor N1 is connected to terminal 3. As for switch K2, it is formed of two bipolar transistors P2 and N2, respectively of NPN and PNP type. The emitter of transistor N2 is connected to the anode gate of thyristor Th4. The collector of transistor N2 is connected to the anode gate of thyristor Th4. The collector of transistor N2 is connected to terminal 3. The base of transistor N2 is connected to the collector of transistor P2, the emitter of which is connected, via resistor R, to terminal 2. The base of transistor P2 is connected to terminal 3.

Transistors N1 and P1 are on during positive halfwaves while transistors P2 and N2 are on during negative halfwaves. Transistors P1 and N2 will preferably be chosen to have a high gain, since they determine the system response time after the zero crossing of the A.C. supply voltage. Transistors N1 and P2 will preferably be chosen to have a lower gain.

As a specific example of implementation, by using control stage 10-3 of the type illustrated in FIG. 8, a resistance R of 330 kilo-ohms and a capacitance C of 330 nanofarads may be provided.

Figure 9:
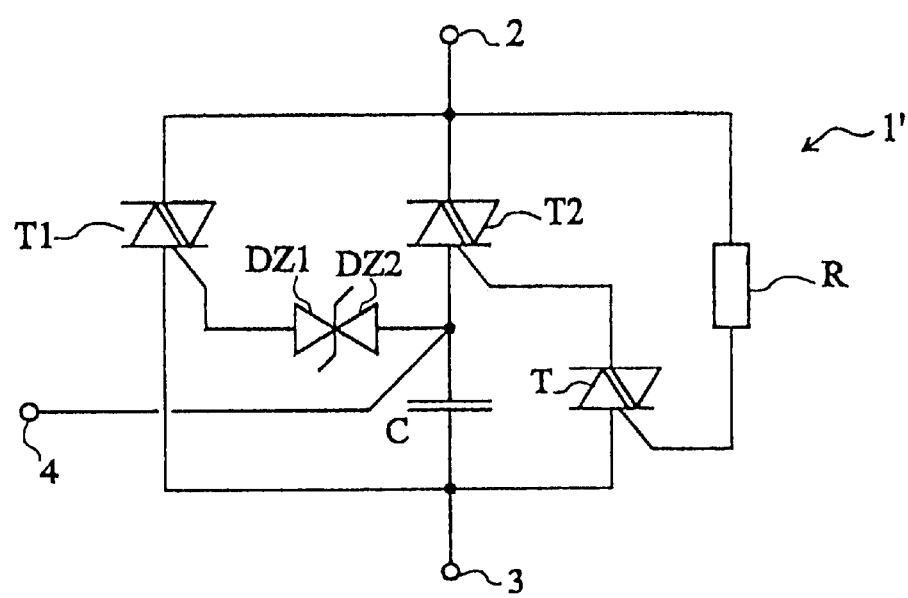
FIG. 9 shows another embodiment of a switch according to the present invention.

FIG. 9 shows another embodiment of a switch 1' according to the present invention, based on the use of triacs. According to this embodiment, a first triac T1 connected between terminals 2 and 3 of application of the A.C. voltage is the equivalent of thyristors Th1 and Th2 of the preceding embodiments. Two Zener diodes DZ1 and DZ2 are placed head-to-tail between the triac gate and control terminal 4, capacitor C still interconnecting terminals 3 and 4. A second triac T2 is connected between terminals 2 and 4 and is the equivalent of thyristors Th3 and Th4 of the preceding embodiments. A third triac T forms switches K1 and K2, like triac T of FIG. 7. It connects the gate of triac T2 to terminal 3, its own gate being connected, via resistor R, to terminal 2. The operation of the switch of FIG. 9 can be deduced from the operation of the preceding embodiments. Of course, this embodiment can be combined with one of the above embodiments.

An advantage of the present invention is that it enables implementing the function of a bistable triac that is capable of being controlled by a single pulse for each switching.

Another advantage of the present invention is that all the power consumption inherent to the system operation is directly drawn from the A.C. voltage source.

Another advantage of the present invention is that, due to the integration of the low-voltage control stage of the switch, it is now possible to integrate other functions (for example, of protection, synchronization, etc.). For example, it may be provided to synchronize the control pulses on the vicinity of the zero crossing of the A.C. power supply by integrating additional low-voltage components to the control stage. A temperature detection associated with an element blocking the operation of the control stage at the end of the halfwave in which an overheating has occurred may also be provided.

Of course, the present invention is likely to have various alterations, modifications, and improvements which will readily occur to those skilled in the art. In particular, the respective sizings of the various switch components depend on the application (in particular on the power and control currents and voltages) and on the desired characteristics in terms of power consumption, dissipation, and response time. For the voltage levels, the concept of high and low voltage should be understood, in the sense of the present invention, by comparing these voltages to each other. The A.C. voltage is, for example, the mains voltage (110 or 220 volts) and low voltage Vcc is, for example, of a given value ranging between 2 and 50 volts. However, the present invention provides advantages for any A.C. voltage, be it high or low as compared to the mains. In a preferred embodiment, the thresholds of the Zener diodes are identical and, preferably, as close as possible to the supply voltage of the switch control circuit. However, as an alternative, the thresholds may be different from one another.

The obtaining of the control signals of low-voltage switch 8 has not been detailed, since it is within the abilities of those skilled in the art based on the functional indications given hereabove and on the desired operation. In particular, the state switching pulses do not have to be synchronized with respect to A.C. voltage Vac. Indeed, if a control pulse appears in the middle of a halfwave, the switch closing is delayed by at most one halfwave. The practical implementation of three-state switch 8 can use conventional manufacturing techniques. In particular, it may be provided to form this switch by a digital circuit by using a three-state output of a logic circuit, or a microcontroller output. It is not necessary to provide two voltages (positive and negative) for the turn-on control of the switch of the present invention. What has been illustrated hereabove in relation with positive or negative pulses merely shows that the switch of the present invention can be controlled independently from the biasing of its control signal with respect to the A.C. power supply.

Moreover, although the present invention has been described hereabove in relation with thyristors for the power portions of the switch, other components having equivalent functions may be used to form these switching elements. Finally, other components and other structures as those described in relation with FIGS. 6 to 8 may be used to form a control stage according to the present invention.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A bidirectional switch, including:
   a first bidirectional switching means between two power terminals of the switch;
   a low-voltage storage element between a first power terminal and a control terminal of the switch; and
   a control stage adapted to cause, upon each halfwave beginning of an A.C. supply voltage applied between the power terminals and when the switch is on, charging of the storage element with a biasing depending on a sign of the halfwave,
   wherein turning-on of the switch is caused by an occurrence of a low-voltage pulse of charge of the storage element on said control terminal.

2. The switch of claim 1, wherein turning-off of the switch is caused by forcing a discharge of the storage element, so that the first bidirectional switching means remains blocked at a beginning of a following halfwave of the A.C. supply voltage.

3. The switch of claim 1, wherein the control stage includes a second bidirectional switching means between said control terminal and a second power terminal of the switch.

4. The switch of claim 1, wherein said first bidirectional switching means is formed of two one-way switching elements connected in antiparallel between the two power terminals of the switch.

5. A bidirectional switch, including:
   a first bidirectional switching means between two power terminals of the switch;
   a low-voltage storage element between a first power terminal and a control terminal of the switch; and
   a control stage adapted to cause, upon each halfwave beginning of an A.C. supply voltage applied between the power terminals and when the switch is on, charging of the storage element with a biasing depending on a sign of the halfwave,
   including means for delaying the turning-on of the first bidirectional switching means with respect to a zero crossing of the A.C. supply voltage, to leave time for charging the storage element.

6. A bidirectional switch, including:
   a first bidirectional switching means between two power terminals of the switch;
   a low-voltage storage element between a first power terminal and a control terminal of the switch; and
   a control stage adapted to cause, upon each halfwave beginning of an A.C. supply voltage applied between the power terminals and when the switch is on, charging of the storage element with a biasing depending on a sign of the halfwave,
   wherein the control stage includes a second bidirectional switching means between said control terminal and a second power terminal of the switch, and
   wherein the control stage includes at least one switch connecting the control terminal of the second switching means to the first power terminal of the switch.

7. The switch of claim 6, wherein said second bidirectional switching means comprises two control thyristors connected in antiparallel, respective gates of which are individually connected to a first terminal of application of the A.C. supply voltage via a switch of the control stage.

8. The switch of claim 6, wherein said second bidirectional switching means is a triac having a gate connected to a first terminal of application of the A.C. supply voltage via a switch of the control stage.

9. A bidirectional switch, including:
   a first bidirectional switching means between two power terminals of the switch;
   a low-voltage storage element between a first power terminal and a control terminal of the switch; and
   a control stage adapted to cause, upon each halfwave beginning of an A.C. supply voltage applied between the power terminals and when the switch is on, charging of the storage element with a biasing depending on a sign of the halfwave, wherein the first bidirectional switch is formed of two one-way switching elements connected in antiparallel between the two power terminals of the switch, and wherein said switching elements are formed by power thyristors respectively having a cathode gate and an anode gate, the gates of said power thyristors being individually connected to the control terminal of the switch via a Zener diode.

10. The switch of claim 9, wherein each power thyristor is associated with a control thyristor (Th3, Th4) having the same type of gate.

11. A bidirectional switch, including:

a first bidirectional switching means between two power terminals of the switch;

a low-voltage storage element between a first power terminal and a control terminal of the switch; and a control stage adapted to cause, upon each halfwave beginning of an A.C. supply voltage applied between the power terminals and when the switch is on, charging of the storage element with a biasing depending on a sign of the halfwave, wherein said first bidirectional switching means is a triac having its gate connected, via two head-to-tail Zener diodes, to the control terminal.

12. A method for bidirectional switching of a load between two terminals of an A.C. supply voltage, comprising acts of:

A) charging a capacitive storage element with a polarity depending on a sign of a halfwave of the A.C. supply voltage, and B) monitoring the polarity of the voltage on the capacitive storage element.

13. The method according to claim 12, wherein the method comprises, prior to the act (A), acts of:

initially charging the capacitive storage element at a low voltage; and providing power for the bidirectional switching of the load thereafter via the A.C. supply voltage.

14. The method according to claim 12, wherein the method further includes an act of:

turning off the bidirectional switching by forcing a discharge of the capacitive storage element.

15. A method for bidirectional switching of a load between two terminals of an A.C. supply voltage, comprising an act of A) providing information about an on or off state of a switch coupled to the load, wherein the act A) includes an act of:

monitoring a polarity of a voltage across a capacitive storage element to provide the information about the on or off state of the switch.

16. A method for operating a bidirectional switching circuit including one control terminal, the bidirectional switching circuit connected in series with a load between an A.C. supply voltage, the method comprising acts of:

A) applying only one first low voltage pulse directly to the control terminal to turn on the bidirectional switching circuit; and B) applying only one second low voltage pulse directly to the control terminal to turn off the bidirectional switching circuit.

* * * * *

UNITED STATES PATENT AND TRADEMARK OFFICE
CERTIFICATE OF CORRECTION

PATENT NO.    : 6,590,349 B2
DATED         : July 8, 2003
INVENTOR(S)   : Laurent Moindron It is certified that error appears in the above-identified patent and that said Letters Patent is hereby corrected as shown below:

<u>Column 7,</u>
Line 21, should read -- with respect to terminals Vcc and 3 to avoid discharge of --

Signed and Sealed this

Seventh Day of October, 2003

JAMES E. ROGAN
*Director of the United States Patent and Trademark Office*